(12) United States Patent
Hagimoto et al.

(10) Patent No.: US 9,692,204 B2
(45) Date of Patent: Jun. 27, 2017

(54) SEMICONDUCTOR LASER ELEMENT AND METHOD OF MAKING SEMICONDUCTOR LASER DEVICE

(71) Applicant: USHIO DENKI KABUSHIKI KAISHA, Tokyo (JP)

(72) Inventors: Masato Hagimoto, Tokyo (JP);
Shintaro Miyamoto, Tokyo (JP);
Koichi Kozu, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/264,012

(22) Filed: Sep. 13, 2016

(65) Prior Publication Data

US 2017/0077674 A1    Mar. 16, 2017

(30) Foreign Application Priority Data

Sep. 15, 2015  (JP) ................................ 2015-181579

(51) Int. Cl.
| | | |
|---|---|---|
| *H01S 5/022* | (2006.01) | |
| *H01S 5/22* | (2006.01) | |
| *H01S 5/042* | (2006.01) | |
| *H01S 5/024* | (2006.01) | |

(52) U.S. Cl.
CPC ...... *H01S 5/02272* (2013.01); *H01S 5/02469* (2013.01); *H01S 5/0425* (2013.01); *H01S 5/22* (2013.01)

(58) Field of Classification Search
CPC ........... H01S 5/22; H01S 5/02469; H01S 5/34

USPC .... 372/45.01, 50.1, 46; 257/88, E21.002, 14
See application file for complete search history.

(56) References Cited

U.S. PATENT DOCUMENTS

| | | | |
|---|---|---|---|
| 6,356,572 B1 | 3/2002 | Tanaka et al. | |
| 2008/0240194 A1* | 10/2008 | Maeda | ............... H01S 5/18355 372/50.1 |
| 2011/0299560 A1* | 12/2011 | Takagi | .................. B82Y 20/00 372/44.011 |
| 2012/0230361 A1* | 9/2012 | Adachi | ..................... H01S 5/18 372/45.01 |

FOREIGN PATENT DOCUMENTS

JP  H11-274635  10/1999

* cited by examiner

*Primary Examiner* — Tuan Nguyen
(74) *Attorney, Agent, or Firm* — Studebaker & Brackett PC

(57) ABSTRACT

A semiconductor laser element includes an inclined substrate, a semiconductor layer formed on one surface of the substrate, a first electrode (n-type electrode) formed on an opposite surface of the substrate, a second electrode (p-type electrode) formed on the semiconductor layer, and a current constriction part formed in the semiconductor layer. The semiconductor layer has a multi-layer structure including at least an active layer. The current constriction part causes a current to concentrate and flow to a particular area of the active layer. The first electrode or the second electrode is joined to a sub-mount. In one embodiment, the location of the current constriction part in a chip width direction is between the center of one of the first and second electrodes, which is joined to the sub-mount, and the center of the other electrode, which is not joined to the sub-mount, when viewed in the chip width direction.

15 Claims, 5 Drawing Sheets

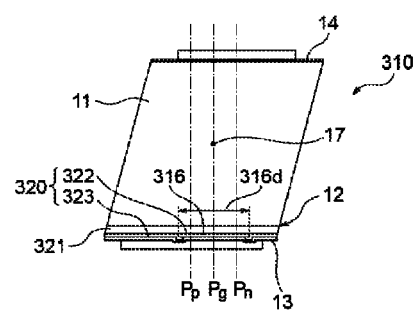

SEMICONDUCTOR LASER ELEMENT AND METHOD OF MAKING SEMICONDUCTOR LASER DEVICE

FIELD OF THE INVENTION

The present invention relates to a semiconductor laser element (laser diode) and a method of manufacturing a semiconductor laser device.

DESCRIPTION OF THE RELATED ART

Conventionally, an edge emitting semiconductor laser element usually has a GaAs substrate, an InP substrate, a GaN substrate, an Si substrate or the like. In case of a red laser diode (LD), for example, an AlGaInP-based crystal is grown on a GaAs substrate by a MOCVD (Metal Organic Chemical Vapor Deposition) method or a similar method.

However, when the GaAs substrate is used, AlGaInP forms a natural superlattice. If the AlGaInP-based crystal is grown on the GaAs substrate, a band-gap energy is larger when group III atoms are disorderly arranged and form the natural superlattice than when group III atoms are orderly (regularly) arranged and form the natural superlattice if the crystal composition is the same. The light emission wavelength of the semiconductor laser element is decided by the band-gap energy of an active layer. In order to obtain a laser beam at a short wavelength, therefore, the active layer needs to have a large band-gap energy.

When AlGaInP is grown on a substrate crystal, and a plane orientation (plane direction) of a principal plane (surface) of the substrate crystal is inclined in a particular direction, then the formation of the natural superlattice is suppressed, and the resulting crystal can have a large band-gap energy even if the composition is the same. This is known in the art. For example, Japanese Patent Application Laid-open Publication No. Hei 11-274635 discloses a semiconductor laser element that uses a canted GaAs substrate (inclined substrate). The plane orientation of the GaAs substrate is inclined by 5-15 degrees from the (100) plane.

SUMMARY OF THE INVENTION

In recent years, there is a demand for a semiconductor laser that can provide a higher optical output, and the length of a chip cavity (resonator length) becomes longer. However, if the cavity length becomes longer, the number of chips to be obtained from a single wafer decreases. This increases a manufacturing cost. To avoid this, a chip width that is measured in a direction perpendicular to the cavity direction of the chip is reduced such that a certain number of chips are obtained from a single wafer.

However, the inclined substrate disclosed in Japanese Patent Application Laid-open Publication No. Hei 11-274635 is used in the chip having a narrow width, the method of manufacturing the semiconductor laser device encounters some problems when the chip is joined to (mounted on) a sub-mount. For example, when the chip is joined to the sub-mount, and an excessive load is applied onto the chip in order to improve the wettability to solder, then the chip may tilt, fall, collapse or break because the chip width is small. If the chip tilts, the heat dissipation may drop and/or the polarization performance drop because of insufficient wettability. This deteriorates the reliability of the resulting product (laser device). On the other hand, if a load is reduced in order to prevent the tilting of the chip and the breakage of the chip, then the chip is not wet with the solder, and the heat dissipation decreases. This also deteriorates the reliability of the resulting product.

The present invention is proposed to overcome the above-described problems, and an object of the present invention is to provide a semiconductor laser element that is joined to a sub-mount in a desired manner even when the inclined substrate is used and the width of the substrate is relatively small in the direction perpendicular to the cavity direction.

Another object of the present invention is to provide a method of manufacturing a laser device that includes such semiconductor laser element.

According to an aspect of the present invention, there is provided a semiconductor laser element that includes a semiconductor chip. The semiconductor chip has a substrate. The substrate has four side faces, a top face and a bottom face. Two of the four side faces are inclined side surfaces which face each other in a first direction, and another two side faces are vertical side surfaces which face each other in a second direction. The second direction is perpendicular to the first direction. Each vertical side surface has a parallelogram shape. The semiconductor chip also has a semiconductor layer formed on one of the top and bottom faces of the substrate, a first electrode formed on the other of the top and bottom faces of the substrate, and a second electrode formed on the semiconductor layer. The semiconductor layer has a multi-layer structure including at least an active layer. The semiconductor chip also has a current constriction part formed in the semiconductor layer. The current constriction part causes the current to concentrate and flow to a particular area of the active layer. The first electrode or the second electrode (the top or bottom face of the substrate) will be joined to a sub-mount when the semiconductor laser element is assembled in a laser device. The location of the current constriction part in the first direction is offset from the center of one of the top and bottom faces of the substrate, on which the electrode (first or second electrode) to be joined to the sub-mount is formed, toward the center of the other of the top and bottom faces of the substrate, when viewed in the chip width direction.

When the semiconductor laser element is joined to the sub-mount, the semiconductor laser element is placed on the sub-mount and then a force is applied onto the semiconductor laser element. Usually, the force is applied onto the semiconductor laser element between the center of that face (the top or bottom face) of the chip, which will be joined to the sub-mount, and the center of the opposite face of the chip, when viewed in the chip width direction. Because the current constriction part is formed at a position offset from the center of one of the top and bottom faces of the substrate, on which the electrode (first or second electrode) to be joined to the sub-mount is formed, toward the center of the other of the top and bottom faces of the substrate, when viewed in the chip width direction, a relatively small force is enough to join the chip to the sub-mount in a desired manner (enough to ensure the wetting of the chip with the solder). Accordingly, even when the width of the substrate of the semiconductor laser element is small in a direction perpendicular to the cavity direction and the semiconductor laser element has the inclined substrate, it is still possible to prevent the chip from leaning (tilting), falling, collapsing and/or breaking when the chip is joined to the sub-mount.

The location of the current constriction part in the first direction may be on a line that extends through the center of gravity of the semiconductor chip when viewed in the first direction.

The semiconductor laser element may be suction-held by a collet or the like in order to convey the semiconductor laser element to the sub-mount and join the semiconductor laser element to the sub-mount. In order for the collet to catch and hold the semiconductor laser element in a stable manner, the collet firstly approaches the semiconductor laser element along the line extending through the center of gravity of the semiconductor laser element, and the collet contacts and catches the semiconductor laser element. When the collet joins the semiconductor laser element to the sub-mount, the collet may apply a joining force onto the semiconductor laser element while the collet is contacting the semiconductor laser element in the same manner as the collet catches and holds the semiconductor laser element. When the location of the current constriction part is on the line that extends through the center of gravity of the semiconductor laser element, it is possible to join the semiconductor laser element to the sub-mount with a relatively small force in a desired manner.

Alternatively, the location of the current constriction part in the first direction may be on a line that extends through the center of one of the first and second electrodes which will not be joined to the sub-mount when viewed in the first direction (chip width direction).

Alternatively, the location of the current constriction part in the first direction may be on a line that extends through the center of that face of the chip, on which the electrode (first or second electrode) not to be joined to the sub-mount is provided, when viewed in the first direction (chip width direction).

When the collet catches and holds, by suction, the semiconductor laser element to convey the semiconductor laser element to the sub-mount, the collet may firstly approach the semiconductor laser element along the center line of that face of the semiconductor laser element which will not be joined to the sub-mount until the collet contacts and catches the semiconductor laser element. When the collet joins the semiconductor laser element to the sub-mount, the collet may apply a joining force onto the semiconductor laser element while the collet is contacting the semiconductor laser element in the same manner as the collet catches and holds the semiconductor laser element. When the location of the current constriction part is on the line that extends through the center of the face of the semiconductor laser element which is not joined to the sub-mount, as viewed in the chip width direction, it is possible to join the semiconductor laser element to the sub-mount with a relatively small force in a desired manner.

The current constriction part of the semiconductor laser element may have a ridge structure. The current constriction part having the ridge structure can provide good light output characteristics.

The current constriction part of the semiconductor laser element may have a plurality of ridges arranged in the first direction. A center position of the ridges in the first direction may be the location of the current constriction part in the first direction. With this configuration, it is possible to appropriately join the semiconductor laser element to the sub-mount even when the current constriction part has a plurality of ridges.

The first electrode of the semiconductor laser element may be the electrode that will not be joined to the sub-mount, and the second electrode may be the other electrode that will be joined to the sub-mount. This is called a junction down method. As the semiconductor laser element (the second electrode) is joined to the sub-mount by the junction down method, the heat dissipation of the semiconductor laser element is improved.

According to another aspect of the present invention, there is provided a method of manufacturing a semiconductor laser element. The semiconductor laser element manufacturing method includes preparing a substrate. The substrate has four side faces, a top face and a bottom face. Two side faces of the four side faces are inclined side surfaces which face each other in a first direction, and another two side faces are vertical side surfaces which face each other in a second direction. The second direction is perpendicular to the first direction. Each vertical side surface has a parallelogram shape. The semiconductor laser element manufacturing method also includes forming a semiconductor layer on one of the top and bottom faces of the substrate. The semiconductor layer has a multi-layer structure including at least an active layer. The semiconductor laser element manufacturing method also includes forming a first electrode formed on the other of the top and bottom faces of the substrate. The semiconductor laser element manufacturing method also includes forming a second electrode formed on the semiconductor layer. The semiconductor laser element manufacturing method also includes forming a current constriction part in the semiconductor layer. The current constriction part is configured to cause a current to concentrate and flow to a particular area of the active layer. The location of the current constriction part in the first direction is offset from a center of that face (the top or bottom face) of the chip, on which the electrode (the first or second electrode) to be joined to a sub-mount is provided toward the center of the opposite face of the substrate, when viewed in the chip width direction.

With this semiconductor laser element manufacturing method, it is possible to provide a semiconductor laser element that can appropriately be joined to the sub-mount with a relatively small force. Even when the inclined substrate is used and the width of the inclined substrate is small in a direction perpendicular to the cavity direction, it is still possible to manufacture a semiconductor laser element having high reliability that does not tilt, fall, collapse and/or break when the semiconductor laser element is joined to the sub-mount.

According to still another aspect of the present invention, there is provided a method of manufacturing a semiconductor laser device. The semiconductor laser device manufacturing method includes preparing a semiconductor laser element according to one of the aspects of the present invention as described above. The semiconductor laser device manufacturing method also includes placing the semiconductor laser element on the sub-mount such that one of the first and second electrodes faces or contacts the sub-mount. The semiconductor laser device manufacturing method also includes applying a force onto the semiconductor laser element in a direction perpendicular to a joining plane between said one of the first and second electrodes and the sub-mount so as to join the semiconductor laser element to the sub-mount. With this semiconductor laser device manufacturing method, it is possible to provide a semiconductor laser device having high reliability in which the semiconductor laser element is appropriately joined to the sub-mount.

According to yet another aspect of the present invention, there is provided a method of manufacturing a semiconductor laser device. The semiconductor laser device manufacturing method includes preparing a semiconductor laser element. The semiconductor laser element includes a substrate, a semiconductor layer, a first electrode, a second electrode, and a current constriction part. The substrate has four side faces, a top face and a bottom face. Two side faces of the four side faces are inclined side surfaces which face each other in a first direction, and another two side faces are vertical side surfaces which face each other in a second direction. The second direction is perpendicular to the first direction. Each vertical side surface has a parallelogram shape. The semiconductor layer is formed on one of the top and bottom faces of the substrate. The semiconductor layer has a multi-layer structure including at least an active layer. The first electrode is formed on the other of the top and bottom faces of the substrate. The second electrode is formed on the semiconductor layer. The current constriction part is formed in the semiconductor layer. The current constriction part is configured to cause a current to concentrate and flow to a particular area of the active layer. The semiconductor laser device manufacturing method also includes placing the semiconductor laser element on a sub-mount such that one of the first and second electrodes contacts or faces the sub-mount. The semiconductor laser device manufacturing method also includes applying a force onto the semiconductor laser element in a direction perpendicular to a joining plane between said one of the first and second electrodes and the sub-mount from above the current constriction part, so as to join the semiconductor laser element to the sub-mount. With this semiconductor laser device manufacturing method, the semiconductor laser element is appropriately joined to the sub-mount, and the semiconductor laser device has high reliability.

The semiconductor laser element (semiconductor laser chip) of the invention can prevent the tilting of the semiconductor laser chip, the falling of the semiconductor laser chip, and the breaking of the semiconductor laser chip when the semiconductor laser chip is joined to the sub-mount even if the inclined substrate is used and the width of the inclined substrate is relatively small in a direction perpendicular to the cavity direction. Thus, it is possible to join the semiconductor laser chip to the sub-mount in a desired manner. Accordingly, the reliability of a resulting product (laser device) that includes the semiconductor laser element is ensured, and the semiconductor laser element (laser device) can emit light having a higher optical output at a shorter wavelength.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 8 is a cross-sectional view that shows an exemplary configuration of a semiconductor chip according to a fourth embodiment of the present invention.

DETAILED DESCRIPTION OF THE INVENTION

Now, embodiments of the present invention will be described with reference to the accompanying drawings.

First Embodiment

Figure 1:
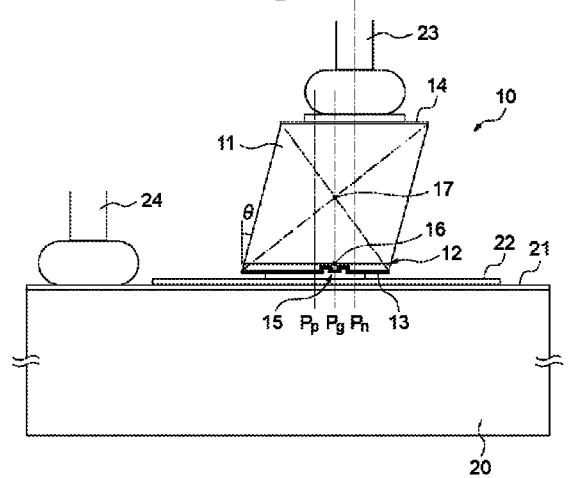
FIG. 1 is a cross-sectional view that shows an exemplary configuration of a semiconductor chip according to a first embodiment of the present invention.

Referring to FIG. 1, an exemplary configuration of a semiconductor chip 10, which serves as a semiconductor laser element of this embodiment, will be described.

The semiconductor chip (hereinafter simply referred to as "chip") 10 of the semiconductor laser element oscillates to emit a laser beam when the chip is assembled into a semiconductor laser device and is supplied with a predetermined injection current. The chip 10 has a semiconductor substrate 11. The substrate 11 is an inclined substrate (inclination angle is θ). A semiconductor layer having a multi-layer structure is formed on a principal surface of the semiconductor substrate 11 by epitaxial growth. The semiconductor substrate 11 is, for example, an n-GaAs substrate. The principal surface of the substrate 11 is inclined at the predetermined inclination angle θ (e.g., 15 degrees) in the <011> direction from the (100) plane. Thus, the semiconductor substrate 11 has a parallelepiped shape. The parallelepiped shape includes four side faces, a top face and a bottom face. The four side faces include two inclined side faces, which face each other in a first direction (right-left direction in FIG. 1), and another two side faces or vertical faces, which face each other in a second direction. The second direction is perpendicular to the first direction (vertical direction to the drawing sheet of FIG. 1). The vertical face has a parallelogram shape, which includes a diamond shape. In the following description, the semiconductor substrate 11 is occasionally referred to as "inclined substrate."

In this embodiment, the chip 10 oscillates to emit a laser beam at some 600 nm wavelength when the chip 10 is assembled in a semiconductor laser device and supplied with a predetermined injection current. In this embodiment, the thickness (height) of the inclined substrate 11, which corresponds to the thickness of the chip 10, is from 50 μm to 200 μm (e.g., 100 μm). The width of the inclined substrate 11, which corresponds to the width of the chip 10, in the first direction is equal to or less than 150 μm (e.g., 100 μm). The inclination angle θ is from 3 degrees to 20 degrees (e.g., 15 degrees). In this embodiment, the length of the chip 10 (resonator length) in the second direction is from 300 μm to 3000 μm (e.g., 2000 μm).

The semiconductor layer includes an active layer 12 (e.g., GaInP layer). Specifically, the semiconductor layer has, at least, a first conduction-type semiconductor layer, the active layer 12, and a second conduction-type semiconductor layer. The semiconductor layer is formed on the lower face (bottom face) of the inclined substrate 11. The first conduction-type semiconductor layer, the active layer 12, and the second conduction-type semiconductor layer are stacked in this order. In FIG. 1, the first conduction-type semiconductor layer is formed on an upper face of the active layer 12. The first conduction-type semiconductor layer is an n-type cladding layer (e.g., n-AlGaInP layer). The second conduction-type semiconductor layer is formed on a lower face of the active layer 12 (formed under the active layer 12). The second conduction-type semiconductor layer is a p-type cladding layer (e.g., p-AlGaInP layer). The chip 10 has a p-type electrode (second electrode) 13 formed under the semiconductor layer (on the bottom face of the semiconductor layer), and an n-type electrode (first electrode) 14 on top of the inclined substrate 11 (on the top face of the substrate). In this embodiment, the center of the p-type electrode 13 is aligned with the center of that surface (bottom face) of the chip 10 which contacts the p-type electrode 13. Likewise, the center of the n-type electrode 14 is aligned with the center of that surface (top face) of the chip 10 which contacts the n-type electrode 14.

A ridge portion 15 having a protrusion is formed on the lower surface of the chip 10, i.e., the ridge portion 15 is formed on that surface of the chip 10 which contacts the p-type electrode (p-type cladding layer) 13. The ridge portion 15 is a current constriction part that concentrates and injects the current in a particular area in the active layer 12 which serves as a light emitting part. Thus, in FIG. 1, a point 16 in the active layer 12 that corresponds to the ridge portion 15 becomes a light emitting point, and the light emitting point 16 emits a laser beam.

The ridge portion 15 is formed on the line Pg that extends in a direction perpendicular to the first direction and the second direction (cavity direction) and that passes through the center of gravity 17 of the chip 10, as shown in FIG. 1. The line Pg is a vertical line to a surface that joins to the sub-mount 20 (will be described later). In other words, the location of the ridge portion 15 in the first direction (chip width direction) corresponds to the position of the center of gravity 17 of the chip 10 in the first direction. The line Pg is a line that extends through the center of gravity 17 of the chip 10 in FIG. 1.

The chip 10 is joined to the sub-mount 20 of the semiconductor laser device. A main body of the sub-mount 20 is made from, for example, aluminum nitride (AlN). The material of the main body of the sub-mount 20 is decided appropriately on the basis of the heat dissipation, the insulation, the difference in the linear expansion coefficient between the sub-mount and the semiconductor laser chip, the cost and the like. If the heat dissipation and the insulation are considered, the material of the main body of the sub-mount 20 may be silicon carbide (SiC) or diamond. If the conductivity is considered, the material of the main body of the sub-mount 20 may be Cu, CuW or CuMo. If the cost is considered, the material of the main body of the sub-mount 20 may be Si or aluminum oxide ($Al_2O_3$). It should be noted that the main body of the sub-mount 20 may made from a combination of the insulation material, such as SiC, and the conductive material, such as Cu. An electrode wiring 21 is formed on the surface of the sub-mount 20. The material of the electrode wiring 21 is gold (Au). The chip 10 is joined onto the electrode wiring 21 by a junction down method with, for example, gold-tin (AuSn) solder 22. The surface of the p-type electrode 13 (i.e., the light emitting surface of the chip 10, or the active layer 12 side surface of the chip 10) serves as a joining surface to the sub-mount 20. Thus, the p-type electrode 13 is electrically connected to the electrode wiring 21 of the sub-mount 20. The bonding material to the surface of the sub-mount 20 may be solder, such as tin-silver-copper (SnAgCu), tin-silver (SnAg), or tin-gold (SnAu), or a metallic material having a low melting point, such as indium (In) or silver (Ag) paste. The n-type electrode 14 is connected to an electrode (not shown), which is provided to feed the injunction current, by wiring (Au wire) 23, and the electrode wiring 21 is connected to another electrode (not shown), which is provided to feed the injection current, by wiring (Au wire) 24. The diameter of each of the Au wires 23 and 24 is, for example, 25 µm.

It should be noted that the location of the ridge portion 15 in the chip width direction is not limited to "on the line Pg" that corresponds to the center of gravity 17 of the chip 10 in the chip width direction. It is satisfactory as long as the location of the ridge portion 15 in the chip width direction is offset from the line Pp toward the line Pn. In other words, it is satisfactory as long as the location of the ridge portion 15 in the chip width direction is on the right side of the line Pp in FIG. 1. The line Pn extends through the center of the top face of the substrate 11 on which the electrode 14 is formed. This is between the center position of that surface (lower surface or the p-type electrode 13 surface) of the chip 10 which is joined to the sub-mount 20 and the center position of the opposite surface of the chip which is not joined to the sub-mount 20 when viewed in the chip width direction.

In this embodiment, therefore, the location of the ridge portion 15 in the chip width direction is on the right side of the center line Pp of that surface of the chip which contacts the sub-mount 20 when viewed in the chip width direction. Preferably, the location of the ridge portion 15 in the chip width direction is between the center line Pp of the p-type electrode 13 and the center line Pn of the n-type electrode 14.

Now, a method of manufacturing the semiconductor laser device will be described.

Figure 2:
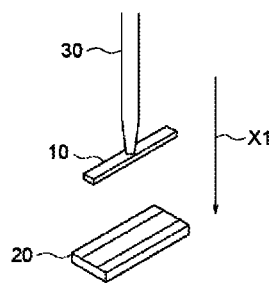
FIG. 2 is a view useful to describe a method of manufacturing a semiconductor laser device.
Figure 3:
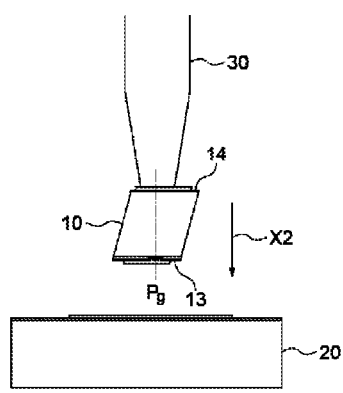
FIG. 3 is a view useful to describe the method of manufacturing the semiconductor laser device.
Figure 4:
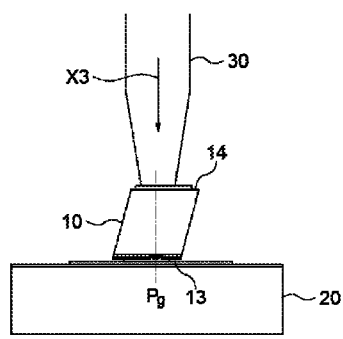
FIG. 4 is a view useful to describe the method of manufacturing the semiconductor laser device.

Firstly, as shown in FIG. 2, the chip 10 is suctioned by a collet 30 by means of vacuum suction, and the chip 10 is conveyed to a predetermined position above a sub-mount 20 by the collet 30. Then, the collet 30 is lowered to place the chip 10 on the sub-mount 20 as indicated by the arrow X1. When the collet 30 catches the chip 10, the collet 30 approaches the chip 10 while moving along the line Pg that passes through the center of gravity of the chip 10. The collet 30 catches and holds an n-type electrode 14 of the chip 10. After catching the chip 10, the collet 30 conveys the chip 10 to the sub-mount 20, as shown in FIG. 3, while moving down as shown by the arrow X2. After the collet 30 places the chip 10 on the sub-mount 20, as shown in FIG. 4, the collet 30 exerts a load (joining force) X3 onto the chip 10 (more precisely, the n-type electrode 14 of the chip 10) in a direction perpendicular to the joining surface. The collet 30 exerts the load X3 along the line Pg, i.e., the collet 30 exerts the force X3 on the chip 10 at a position of the vacuum suction. The force X3 exerted by the collet 30 is from approximately 3 g to 60 g, and preferably from approximately 10 g to 30 g. For example, the force X3 exerted by the collet 30 is 20 g. When the gold-tin solder is used to join the chip 10 to the sub-mount 20, the solder is heated to 280 degrees C. or higher. In this manner, the chip 10 is joined to the sub-mount 20 with the solder+.

Figure 5:
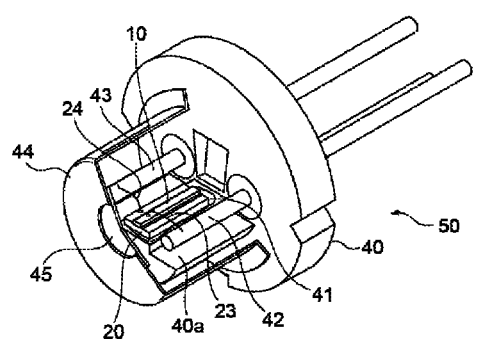
FIG. 5 is a view useful to describe the method of manufacturing the semiconductor laser device.

After the chip 10 is joined to the sub-mount 20, the chip 10 and the sub-mount 20 are joined to a disc-shaped stem 40 of a semiconductor laser device 50, as shown in FIG. 5. The stem 40 has a heat sink 40a near the center of the stem 40, and the sub-mount 20, on which the chip 10 is mounted, is joined to the heat sink 40a by solder 41. The sub-mount 20 is attached to the heat sink 40a such that the laser light emitting direction of the chip 10 coincides with a direction vertical to the disc-shaped surface of the stem 40.

The stem 40 may be made from an Fe alloy. Alternatively, the stem 40 may be made from a gold-plated iron (Fe) or a gold-plated copper (Cu). The heat sink 40a may be made from a metal that has a good heat conduction such as copper (Cu). Leads 42 and 43 are secured to the stem 40 such that the leads 42 and 43 serve as the electrodes for feeding the injunction current. The leads 42 and 43 are electrically insulated from the stem 40.

As the sub-mount 20 that carries the chip 10 thereon is mounted on the heat sink 40a, the n-type electrode 14 (FIG. 1) is electrically connected to the lead 42 by the Au wire 23 by means of wire bonding, as shown in FIG. 5. The electrode wire 21 (FIG. 1) on the surface of the sub-mount 20 is electrically connected to the lead 43 by the Au wire 24 by means of wire bonding. Thus, the electricity feeding to the p-type electrode 13 (FIG. 1) becomes possible.

Finally, a cylindrical cap 44 is placed over the disc-shaped surface of the stem 40, and the cap 44 is air-tightly joined to the stem 40 by welding or the like. Thus, the heat sink 40a of the stem 40, the leads 42 and 43, the sub-mount 20, the chip 10 and the Au wires 23 and 24 are covered with (received in) the cap 44. The cap 44 is made from, for example, a metallic material, and protects the chip 10, the Au wires 23 and 24, and other components that are received in the cap 44. The cap 44 has a window (light transmitting window) 45 at the center of the top surface of the cap 44 as an exit of the light (laser beam) emitted from the chip 10.

In this manner, the semiconductor laser device 50 is manufactured. Upon applying a predetermined voltage across the leads 42 and 43 of the semiconductor laser device 50, the laser beam is emitted from the edge of the chip 10, and is radiated to the outside from the stem 40 through the light exit window 45.

In the method of manufacturing the semiconductor laser device 50 shown in FIG. 2 to FIG. 5, the chip 10 is mounted on the sub-mount 20, and then the sub-mount 20, which carries the chip 10 thereon, is mounted on the stem 40. It should be noted that the method of manufacturing the semiconductor laser device 50 of the present invention is not limited in this regard. For example, the sub-mount 20 may be joined to the heat sink 40a of the stem 40, and then the chip 40 may be mounted on the sub-mount 20. Alternatively, the process of joining the sub-mount 20 to the heat sink 40a may be carried out at the same time when the process of joining the chip 10 on the sub-mount 20 is carried out. Joining the sub-mount 20 to the heat sink 40a, and joining the chip 10 on the sub-mount 20 may be carried out in a single process.

As described above, the inclined substrate 11 is used as the substrate of the chip 10 in this embodiment. Because the inclined substrate 11 is used, the natural superlattice of AlGaInP, in which the group III atoms are arranged periodically (orderly), is eliminated, and the band gap can be expanded. For example, in case of AlGaInP having the same composition, AlGaInP, in which the group III atoms are arranged disorderly, can expand the band gap by approximately 50 meV to 100 meV as compared to AlGaInP, in which the natural superlattice is formed. Accordingly, when the inclined substrate is used, it is possible to emit a red laser beam in the short wavelength range (equal to or below 690 nm; for example 640 nm). In addition, when the inclined substrate is used, a p-type dopant is easy to enter, and a high concentration doping becomes possible. Thus, it is possible to impart desired characteristics to the semiconductor laser device and improve the quality of the crystal. This contributes to an improvement in reliability of the semiconductor laser element and the semiconductor laser device.

In this embodiment, the ridge portion 15 is provided as the current construction part that causes the current to concentrate and flow to a particular area of the active layer 12. The ridge structure makes it possible to concentratedly feed the current to the particular area of the active layer 12 in an efficient manner, and convert the injected current into a laser beam in an efficient manner. Accordingly, the semiconductor laser element can provide a higher optical output (can emit a high-power laser beam).

In this embodiment, the location of the ridge 15 in the chip width direction is "on the line Pg" that extends through the center of gravity 17 of the chip 10 in the chip direction. Thus, the ridge 15 is formed just below the center of gravity 17 of the chip 10, when viewed in the chip width direction. It is then possible to appropriately mount (join) the chip 10 on the sub-mount 20.

When the collet 30 catches the chip 10 to join the chip 10 to the sub-mount 20, it is necessary to pick up (lift) the chip 10 in a stable manner. Then, it is necessary for the collet 30 to suck and hold the center of gravity of the chip 10. When the collet 30 places the chip 10 on the sub-mount 20 and joins the chip 10 to the sub-mount 20, the collet 30 applies the force onto the chip 10 while the collet 30 is holding the chip 10. Thus, the collet 30 applies the force to that area of the chip 10 which is sucked and held by the collet 30.

In this embodiment, the ridge portion 15 is formed just below the center of gravity 17 of the chip 10 when viewed in the chip width direction, and therefore the collet 30 can exert a force from just above the ridge portion 15, i.e., from just above the light emitting point 16. Because of this, it is possible to improve the wetting of the solder at the light emitting portion without exerting a large force. In other words, it is possible to improve the wettability of the solder at the light emitting portion in an efficient manner Thus, when the chip 10 is joined to the sub-mount 20, an excessive force is not necessary. In other words, when the chip 10 is mounted on the sub-mount 20, the chip 10 does not break, crack, or tilt. If the chip 10 tilts, the wetting becomes insufficient. Then, the heat dissipation is deteriorated and the polarization is deteriorated. Because this embodiment can prevent the chip 10 from tilting, it is possible to ensure the appropriate functioning of the semiconductor laser element at a high temperature, and provide a good polarization.

If the ridge portion 15 was formed on the line Pp that extends through the center of the p-type electrode 13 when viewed in the chip width direction, then the light emitting point would greatly be offset in the chip width direction (to the left in FIG. 1) from the point (line) of the force exerted on the chip 10 by the collet (i.e., from the line Pg extending through the center of gravity 17 of the chip 10, or from the line Pn extending through the center of the n-type electrode 14). With such offset, it would be necessary to apply a large force onto the chip 10 in order to ensure that the light emitting part of the chip 10 becomes sufficiently wet by the solder. If the force applied onto the chip 10 was too small, the chip 10 would not become wet by the solder, and the heat dissipation of the chip 10 would drop.

In recent years, the chip of the semiconductor laser element tends to have a longer cavity length (longer resonator length) and a shorter chip width in order to provide an increased output (high-power laser beam) at a reduced cost. For example, when the semiconductor laser element is designed to generate an optical output of 50 mW, the cavity length is 800 µm and the chip width is 250 µm. On the other hand, when the semiconductor laser element is designed to generate an optical output of 150 mW, the cavity length is elongated to 2000 µm in order to enhance the heat dissipation. In this example, if the number of chips to be obtained from a single wafer should be the same as the semiconductor laser element that is designed to generate an optical output of 50 mW, then the chip width should be reduced to 100 µm. However, if the chip width is reduced for the semiconductor laser element having the inclined substrate, the cross-sectional shape of the chip in a direction perpendicular to the resonator direction becomes similar to a diamond shape. Thus, the chip easily tilts, falls, collapses or break when a force is applied onto the chip in order to join the chip to the sub-mount.

The side faces of the inclined substrate are cleavage planes. In case of the GaAs substrate, for example, the thickness of the inclined substrate is approximately 100 μm. If the thickness of the substrate is equal to or greater than, for example, 200 μm, the thickness of the substrate is too large, and it is difficult to form the edge face (side face) by cleavage. On the other hand, if the thickness of the substrate is equal to or smaller than 50 μm, the thickness of the substrate is too small, and the substrate may crack during the mounting process, and the yield may drop. The drop of the yield results in an increase in cost. Therefore, the substrate thickness is approximately 100 μm.

As such, when the chip width becomes equal to or smaller than 150 μm, the cross-sectional shape of the chip takes a shape like a diamond, and the above-mentioned problems are likely to occur. If the chip width is represented by W, the substrate thickness is represented by t, and the inclination angle of the substrate is represented by θ, then the width of the chip that can receive a force from the collet is given by an equation of "W−t×tan θ." If this width is smaller than the substrate thickness t, the position of the center of gravity of the chip becomes high relative to the chip width. Thus, the chip becomes unstable to the force applied from the collet in the vertical direction, i.e., the chip is easy to fall. As a result, a large force cannot be applied to the chip when the chip is joined to the sub-mount, if the chip has the above-mentioned inclined substrate. Consequently, it becomes very difficult to appropriately join the chip to the sub-mount. As the cavity length of the chip becomes longer, the end faces of the chip become difficult to get wet with the solder as compared to the center area of the chip. Thus, it is necessary to apply a larger force onto the chip as the cavity length of the chip is elongated. However, if the chip width is small, the chip is easy to collapse or break. Specifically, if the ratio of the cavity length L to the chip width W (L/W) is greater than 10, then the chip is likely to collapse or break, and it is difficult to sufficiently join the chip 10 to the sub-mount 20 with an appropriate force that ensures the good wetting to the solder.

On the other hand, the chip 10 of the semiconductor laser element according to the above-described embodiment can improve or ensure the wetting to the solder with a relatively small force, as described above. Thus, when the chip 10 is joined to the sub-mount 20, it is not necessary apply a large force onto the chip 10. As such, even if the chip 10 has the inclined substrate having a small width, the chip 10 does not fall, collapse or break with the force applied from the top of the chip when the chip 10 is joined to the sub-mount 20. Therefore, the reliability of the semiconductor laser element is ensured, and the semiconductor laser element can generate a high optical output (high-power laser beam) at a short wavelength.

Though the location of the ridge portion 15 in the chip width direction is on the line Pg that extends through the center of gravity 17 of the chip 10 in the above-described embodiment, the present invention is not limited in this regard. For example, the location of the ridge portion 15 in the chip width direction may be on the line Pn that extends through the center of the n-type electrode 14 (or the center of that surface of the chip on which the n-type electrode 14 is disposed). In such instance, the collet 30 may approach (move downward to) the n-type electrode 14 along the line Pn to catch the chip 10. Then, the collet 30 may apply a force onto the chip 10 (center of the n-type electrode 14) while keeping the contact between the collet 30 and the n-type electrode 14 on the line Pn, thereby joining the chip 10 to the sub-mount 20. When the collet 30 applies a force onto the chip 10 along the line Pn to join the chip 10 to the sub-mount 20, and the location of the ridge portion 15 in the chip directions is on the line Pn, then the same advantages as when the collet 30 applies a force onto the chip 10 along the line Pg and the location of the ridge portion 15 in the chip directions is on the line Pg are obtained.

Second Embodiment

A second embodiment of the present invention will be described below.

In the first embodiment, the semiconductor laser element has a single light emitting point. Thus, the semiconductor laser element of the first embodiment is a single beam semiconductor laser element. The second embodiment deals with a semiconductor laser element that has a plurality of light emitting points. This laser element is a multi-beam semiconductor laser element.

Figure 6:
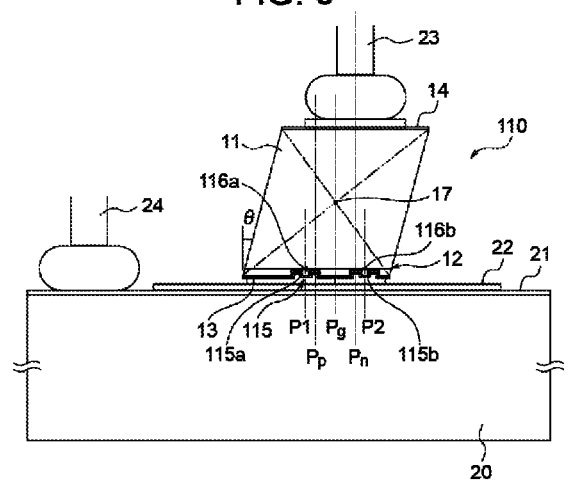
FIG. 6 is a cross-sectional view that shows an exemplary configuration of a semiconductor chip according to a second embodiment of the present invention.

FIG. 6 illustrates a semiconductor chip 110 of a semiconductor laser element according to the second embodiment. Similar components in the first and second embodiments are given similar reference numerals in FIGS. 1 and 6. In the following description, mainly the differences between the first and second embodiments will be described.

The semiconductor chip (hereinafter simply referred to as "chip") 110 includes a p-type electrode 13 (p-type cladding layer), an n-type electrode 14, and a ridge portion 115 formed in the p-type electrode 13. The ridge portion 115 is a current constriction part that causes a current to concentrate and flow to the light emitting parts. The chip 110 has two light emitting parts. In the second embodiment, the ridge portion 115 includes two ridges (two protrusions) 115a and 115b, arranged spacedly from each other in the chip width direction. Accordingly, the points 116a and 116b are the light emitting points (parts) in the second embodiment.

The location of the first ridge 115a of the ridge portion 115 is on the line P1, when viewed in the chip width direction, and the location of the second ridge 115b of the ridge portion 115 is on the line P2. The center line between the lines P1 and P2 is the line Pg that extends through the center of gravity 17 of the chip 110, when viewed in the chip width direction. In other words, the center between the two light emitting points 116a and 116b is just below the center of gravity 17 of the chip 110 in the chip width direction. It should be noted that the center line between the lines P1 and P2 may not necessarily be the line Pg. It is satisfactory as long as the center line between the lines P1 and P2 extends on the right side of the center of the p-type electrode 13.

In the second embodiment, therefore, it is satisfactory as long as the center line between the lines P1 and P2 extends on the right side of the center of the electrode that is joined to the sub-mount 20, or the center line between the lines P1 and P2 is offset from the center of the electrode joined to the sub-mount 20 toward the center of the other electrode that is not joined to the sub-mount 20. Preferably, the center line between the lines P1 and P2 extends between the lines Pp and Pn, or between the line Pp and a line in the vicinity of the line Pp.

As the second embodiment has the above-described structure, it is possible to wet the chip 110 with the solder without applying a large force onto the chip 110, as in the first embodiment. Thus, it is possible to appropriately join (mount) the chip 11 to the sub-mount 20 without causing the chip 110 to fall, collapse or break. Therefore, even when the multi-beam semiconductor laser element has an inclined substrate having a relatively small width in the direction perpendicular to the cavity direction, it is still possible to mount the chip 110 onto the sub-mount 20 in a desired manner. Accordingly, the reliability of the semiconductor laser element is ensured, and the semiconductor laser element can generate a high optical output at a short wavelength.

In FIG. 6, the multi-beam semiconductor laser element has the two light emitting points. The present invention is not limited in this regard. For example, the multi-beam semiconductor laser element may have three or more light emitting points (i.e., three or more ridges). Each light emitting point is associated with each ridge. In such instance, it is satisfactory if the center of the ridges is on the right side of the center of the p-type electrode 13 (or on the right side of the line Pp). For example, when the semiconductor laser element has three light emitting points (i.e., three ridges) arranged at equal intervals in the chip width direction, then the position of the center ridge (second ridge) is between the line Pp (center of the p-type electrode 13) and the line Pn (center of the n-type electrode 14). The position of the center ridge may be on the line Pg that extends through the center of gravity 17 of the chip 110.

Third Embodiment

A third embodiment of the present invention will be described below.

In the first and second embodiments, the current constriction part has the ridge structure that appears on the outer surface of the substrate or the chip. In the third embodiment, the ridge structure of the current constriction part is embedded in the chip.

Figure 7:
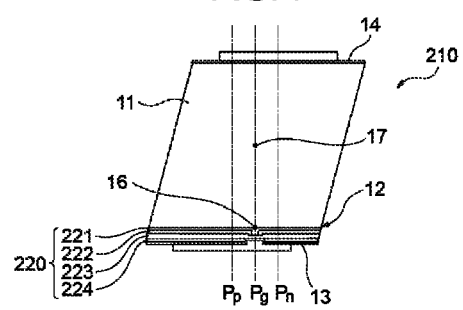
FIG. 7 is a cross-sectional view that shows an exemplary configuration of a semiconductor chip according to a third embodiment of the present invention.

FIG. 7 is a cross-sectional view of a semiconductor chip 210 of a semiconductor laser element according to the third embodiment. Similar reference numerals are used in the first and third embodiment to designate similar components in FIGS. 1 and 7. In the following description of the third embodiment, mainly the differences between the first and third embodiments will be described.

The semiconductor chip (hereinafter simply referred to as "chip") 210 includes a current constriction part 220 having a built-in structure or an embedded structure. The built-in structure is a structure in which outside areas along a current path of the injection current (elongated area) are recessed by an etching process, and other semiconductor layers are stacked in the recesses (concave areas). A method of manufacturing the chip 210 will be described below.

Firstly, a p-type cladding layer (e.g., p-AlGaInP layer) 221 is formed on the lower surface of the substrate 210, and the p-type cladding layer 221 is etched except for an elongated area, which corresponds to a ridge having, for example, an approximately 2 μm width. On both sides of the elongated area, are formed the concave areas. Subsequently, an n-type built-in layer (e.g., n-AlInP layer) 222 is grown in each of the concave areas (on along the ridge area on both sides of the ridge area) by a MOCVD method. The built-in layers serve as current blocking layers. The ridge area is covered with an insulation film such that no crystal for the built-in layer 222 is grown on the ridge area. Thus, the height of the ridge area becomes equal to the height of the neighboring areas where the built-in layers are formed.

After that, the p-type built-in layer (e.g., p-GaAs layer) 223 is grown by the MOCVD method. The p-type built-in layer 223 serves as a contact layer. The built-in layer 223 is crystal grown over the entire surface of the ridge area and the neighboring areas (layer 222) such that the surface of the built-in layer 223 becomes substantially flat. Subsequently, an insulation film 224 is formed by a CVD method. In order to provide an electric contact, part of the insulation film 224 below the ridge is etched to form a current injection part. The current constriction part 220 is formed in this manner. Then, the p-type electrode 13 is formed over a stack of these semiconductor layers 221 to 224. In the chip 210 of the third embodiment, therefore, the ridge is embedded (enclosed) in the crystal.

The location of the ridge of the current constriction part 220 in the chip width direction is on the line Pg that extends through the center of gravity 17 of the chip 210, as shown in FIG. 7. Thus, the light emitting point 16 is present just below the center of gravity 17 of the chip 210 when viewed in the chip width direction. It should be noted that the location of the light emitting point 16 (or the location of the ridge) is not limited to the location shown in FIG. 7. It is satisfactory as long as the ridge of the current constriction part 220 is formed on the right side of the center of the p-type electrode 13 joined to the sub-mount 20 (or on the right side of the center of the chip 210 on which the p-type electrode 13 is provided).

In this embodiment, therefore, the location of the ridge of the current constriction part 220 is on the right side of the line Pp that extends through the center of the p-type electrode 13. Preferably, the location of the ridge of the current constriction part 220 is between the line Pp that extends through the center of the p-type electrode 13 and the line Pn that extends through the center of the n-type electrode 14 (or a line in the vicinity of the line Pn).

Because the semiconductor laser element of the third embodiment has the above-described configuration, it is possible to wet the chip 210 with the solder without applying a large force onto the chip 210. This is similar to the first and second embodiments. In the third embodiment, it is also possible avoid the falling and collapsing of the chip 210 when a joining force is applied onto the chip 210. Thus, the chip 210 is joined to the sub-mount 20 in a desired manner. As such, the semiconductor laser element having the current constriction part, in which the ridge is embedded, can appropriately be joined to the sub-mount 20 even if the inclined substrate of the semiconductor laser element (chip 210) has a relatively small width in a direction perpendicular to the cavity direction. Accordingly, the reliability of the semiconductor laser element is ensured, and the semiconductor laser element can generate a high optical output at a short wavelength.

Fourth Embodiment

A fourth embodiment of the present invention will be described below.

In the third embodiment, the semiconductor laser element has the built-in current constriction part. The semiconductor laser element of the fourth embodiment has another type of current constriction part.

FIG. 8 is a cross-sectional view of an exemplary semiconductor chip 310 of a semiconductor laser element according to the fourth embodiment of the present invention. Similar reference numerals are used in the first and fourth embodiments. In the following description, the difference between the chip 10 of the first embodiment and the chip 310 of the fourth embodiment will mainly be described.

The semiconductor chip (hereinafter simply referred to as "chip") 310 has a current constriction part 320. The current constriction part 320 is formed by patterning an insulation film and a crystal-made contact layer. A method of manufacturing the chip 310 will be described below.

Firstly, a p-type cladding layer (e.g., p-AlInP layer) 321 is formed on the lower surface of the substrate 11, and a p-type contact layer (e.g., p-GaAs layer) 322 is formed on the p-type cladding layer 321. Then, the contact layer 322 is etched to leave a current constriction area (elongated area) having, for example, an approximately 40 μm width, as shown in FIG. 8. Subsequently, an insulation film 323 is formed by a CVD method. In order to provide an electric contact, part of the insulation film 323 is etched and a current injection part is formed. The current constriction part 320 is formed in this manner. The chip 310 has a light emitting point (light emitting part) 316. The width 316d of the light emitting part 316 corresponds to the width of the current constriction area (e.g., approximately 40 μm).

The center of the current constriction area of the current constriction part 320 in the chip width direction is on the line Pg that extends through the center of gravity 17 of the chip 310. Thus, the center of the light emitting part 316 is just below the center of gravity 17 of the chip 310, when viewed in the chip width direction. It should be noted that it is satisfactory as long as the center of the current constriction area (light emitting part) is on the right side of the center of the electrode (13) that is joined to the sub-mount. In other words, it is satisfactory as long as the center of the current constriction area (light emitting part) 316 is offset from the center (Pp) of the electrode (13) that is joined to the sub-mount toward the center (Pn) of the other electrode (14) that is not joined to the sub-mount.

In the illustrated embodiment, the structure of the current constriction part 320 is decided such that the center position of the current constriction area of the constriction part 320 is on the right side of the line Pp that extends through the center of the p-type electrode 13. Preferably, the center of the current constriction area is between the line Pp that extends through the center of the p-type electrode 13 and the line Pn that extends through the center of the n-type electrode 14 (or a line in the vicinity of the line Pn).

Because the semiconductor laser element of the fourth embodiment has the above-described configuration, it is possible to wet the chip 310 with the solder without applying a large force onto the chip 310. This is similar to the first, second and third embodiments. In the fourth embodiment, it is also possible avoid the falling and collapsing of the chip 310 when a joining force is applied onto the chip 310. Thus, the chip 310 is joined to the sub-mount 20 in a desired manner. As such, the semiconductor laser element having the current constriction part 320, in which no ridge is directly associated with the light emitting part, can appropriately be joined to the sub-mount 20 even if the inclined substrate of the semiconductor laser element (chip 310) has a relatively small width in a direction perpendicular to the cavity direction. Accordingly, the reliability of the semiconductor laser element is ensured, and the semiconductor laser element can generate a high optical output at a short wavelength.

Modifications

In each of the above-described embodiments, the inclined substrate 11 is a GaAs substrate. The present invention is not limited in this regard. For example, the inclined substrate 11 may be an InP substrate, a GaN substrate, or an Si substrate. The material of the inclined substrate 11 may be decided depending upon the wavelength of the light to be generated (emitted) from the semiconductor laser element.

In each of the above-described embodiments, the chip 10 (110, 210, 310) is mounted on the sub-mount 20 by the junction down method. The present invention is not limited in this regard. For example, the chip 10 (110, 210, 310) may be mounted on the sub-mount 20 by a junction up method. It should be noted that the junction down method is preferred if the heat dissipation is taken into account because the heat is more released from the chip when the chip is joined to the sub-mount by the junction down method.

In each of the above-described embodiments, the center of the p-type electrode 13 coincides with the center of that face of the chip on which the p-type electrode 13 is formed (i.e., the center of the lower face of the chip) when viewed in the chip width direction, and the center of the n-type electrode 14 coincides with the center of the opposite face of the chip on which the n-type electrode 14 is formed (i.e., the center of the upper face of the chip) when viewed in the chip width direction. The present invention is not limited in this regard. For example, the center of the p-type electrode 13 may be offset from the center of the lower face of the chip when viewed in the chip width direction, and/or the center of the n-type electrode 14 may be offset from the center of the upper face of the chip. With such configuration, the center position of the current constriction part(s) or the current constriction area in the chip width direction is offset from the center of that surface of the chip which is joined to the sub-mount 20 toward (or beyond) the center line of the opposite surface of the chip. Then, such configuration can have the same advantages as the first embodiment.

In the first, third and fourth embodiments, the collet 30 approaches the chip 10 along the line Pg, and catches the chip 10 (FIG. 3). Then, the collet 30 applies the force X3 to the chip 10 along the line Pg when the collet 30 joins the chip to the sub-mount 20 because the light emitting point (current constriction part) is present on the line Pg. Thus, the collet 30 can apply the force to the chip 10 from just above the light emitting point. The present invention is not limited in this regard. For example, if the light emitting point is not present on the line Pg, but on the line Pp, the collet 30 may move to the line Pp after placing the chip 10 on the sub-mount 20. Upon reaching the line Pp, the collet 30 may apply the force to the chip 10 such that the collet 30 applies the force from just above the light emitting point. By moving the collet 30 in this manner after placing the chip 10 on the sub-mount 20, the collet 30 can apply the force to the chip 10 from just above the current constriction part. In this instance, when the collet 30 catches and holds the chip 10, the collet 30 approaches along the line Pg and catches the chip 10. The collet 30 carries the chip 10 to the sub-mount 20, and moves to the line Pp after placing the chip 10 on the sub-mount 20. This modification also brings about the same advantages as the first embodiment. In this manner, it is possible to join the chip to the sub-mount in a desired manner regardless of the location of the light emitting point.

While certain embodiments have been described, these embodiments have been presented by way of example only, and are not intended to limit the scope of the present invention. The novel apparatuses (devices, elements) and methods described herein may be embodied in a variety of other forms; furthermore, various omissions, substitutions and changes in the form of the apparatuses (devices, elements) and methods described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2015-181579, filed Sep. 15, 2015, and the entire contents of which are incorporated herein by reference.

What is claimed is:

1. A semiconductor laser element comprising:
a semiconductor chip, the semiconductor chip including:
a substrate having four side faces, a top face and a bottom face, with two side faces of the four side faces being inclined side surfaces which face each other in a first direction, and another two side faces being vertical side surfaces which face each other in a second direction, the second direction being perpendicular to the first direction, each said vertical side surface having a parallelogram shape;
a semiconductor layer formed on one of the top and bottom faces of the substrate, the semiconductor layer having a multi-layer structure including at least an active layer;
a first electrode formed on the other of the top and bottom faces of the substrate;
a second electrode formed on the semiconductor layer, one of the first electrode and the second electrode being joined to a sub-mount when the semiconductor laser element is assembled in a laser device; and
a current constriction part formed in the semiconductor layer, the current constriction part being configured to cause a current to concentrate and flow to a particular area of the active layer, a location of the current constriction part in the first direction being offset from a center of one of the top and bottom faces of the chip, on which one of the first and second electrodes to be joined to the sub-mount is formed, toward a center of the other of the top and bottom faces of the chip, when viewed in the first direction.

2. The semiconductor laser element according to claim 1, wherein the location of the current constriction part in the first direction is on a line that extends through a center of gravity of the semiconductor chip when viewed in the first direction.

3. The semiconductor laser element according to claim 1, wherein the location of the current constriction part in the first direction is on a line that extends through a center of one of the top and bottom faces of the chip on which one of the first and second electrodes not to be joined to the sub-mount is formed when viewed in the first direction.

4. The semiconductor laser element according to claim 1, wherein the current constriction part has a ridge structure.

5. The semiconductor laser element according to claim 4, wherein the current constriction part has a ridge structure that appears on an outer surface of the semiconductor chip.

6. The semiconductor laser element according to claim 5, wherein the current constriction part has a plurality of ridges arranged in the first direction, and a center position of said plurality of ridges in the first direction is the location of the current constriction part in the first direction.

7. The semiconductor laser element according to claim 4, wherein the current constriction part has a ridge structure that is embedded in the semiconductor chip.

8. The semiconductor laser element according to claim 7, wherein the current constriction part has a plurality of ridges arranged in the first direction, and a center position of said plurality of ridges in the first direction is the location of the current constriction part in the first direction.

9. The semiconductor laser element according to claim 7, wherein the current constriction part has a single ridge, and a position of ridge in the first direction is the location of the current constriction part in the first direction.

10. The semiconductor laser element according to claim 1, wherein the first electrode is an electrode not to be joined to the sub-mount, and the second electrode is an electrode to be joined to the sub-mount.

11. The semiconductor laser element according to claim 1, wherein the first direction is a width direction of the substrate.

12. The semiconductor laser element according to claim 1, wherein the location of the current constriction part in the first direction is between the center of one of the top and bottom faces of the chip, on which one of the first and second electrodes to be joined to the sub-mount is formed, and the center of the other of the top and bottom faces of the chip, when viewed in the first direction.

13. A method of manufacturing a semiconductor laser device comprising:
preparing a semiconductor laser element according to claim 1;
placing the semiconductor laser element on the sub-mount such that one of the first and second electrodes contacts or faces the sub-mount; and
applying a force onto the semiconductor laser element in a direction perpendicular to a joining plane between said one of the first and second electrodes and the sub-mount so as to join the semiconductor laser element to the sub-mount.

14. A method of manufacturing a semiconductor laser element, comprising:
preparing a substrate, the substrate having four side faces, a top face and a bottom face, with two side faces of the four side faces being inclined side surfaces which face each other in a first direction, and the other two side faces being vertical side surfaces which face each other in a second direction, the second direction being perpendicular to the first direction, each said vertical side surface having a parallelogram shape;
forming a semiconductor layer on one of the top and bottom faces of the substrate, the semiconductor layer having a multi-layer structure including at least an active layer;
forming a first electrode formed on the other of the top and bottom faces of the substrate;
forming a second electrode formed on the semiconductor layer; and
forming a current constriction part formed in the semiconductor layer, the current constriction part being configured to cause a current to concentrate and flow to a particular area of the active layer, a location of the current constriction part in the first direction being offset from a center of one of the top and bottom faces of the chip, on which one of the first and second electrodes to be joined to the sub-mount is formed, toward a center of the other of the top and bottom faces of the chip, when viewed in the first direction.

15. A method of manufacturing a semiconductor laser device comprising:
preparing a semiconductor laser element, the semiconductor laser element including a substrate, a semiconductor layer, a first electrode, a second electrode, and a current constriction part, the substrate having four side faces, a top face and a bottom face, with two side faces of the four side faces being inclined side surfaces which face each other in a first direction, and the other two side faces being vertical side surfaces which face each other in a second direction, the second direction being perpendicular to the first direction, each said vertical side surface having a parallelogram shape, the semiconductor layer being formed on one of the top and bottom faces of the substrate, the semiconductor layer having a multi-layer structure including at least an active layer, the first electrode being formed on the other of the top and bottom faces of the substrate, the second electrode being formed on the semiconductor layer, the current constriction part being formed in the semiconductor layer, the current constriction part being configured to cause a current to concentrate and flow to a particular area of the active layer;

placing the semiconductor laser element on a sub-mount such that one of the first and second electrodes contacts or faces the sub-mount; and applying a force onto the semiconductor laser element in a direction perpendicular to a joining plane between said one of the first and second electrodes and the sub-mount from above the current constriction part, so as to join the semiconductor laser element to the sub-mount.

* * * * *